US008481966B1

(12) United States Patent
Makarov et al.

(10) Patent No.: US 8,481,966 B1
(45) Date of Patent: Jul. 9, 2013

(54) MICROPLASMA ION SOURCE FOR FOCUSED ION BEAM APPLICATIONS

(75) Inventors: Vladimir V. Makarov, Fremont, CA (US); Sergey Macheret, Palmdale, CA (US)

(73) Assignee: Tiza Lab, L.L.C., Milpitas, CA (US)

( * ) Notice: Subject to any disclaimer, the term of this patent is extended or adjusted under 35 U.S.C. 154(b) by 0 days.

(21) Appl. No.: 13/407,549

(22) Filed: Feb. 28, 2012

(51) Int. Cl.
| | |
|---|---|
| *H01J 37/08* | (2006.01) |
| *H01J 49/40* | (2006.01) |
| *A61L 2/14* | (2006.01) |
| *H01J 37/32* | (2006.01) |
| *H01J 37/317* | (2006.01) |
| *H01J 27/26* | (2006.01) |
| *H01J 49/16* | (2006.01) |

(52) U.S. Cl.
CPC ....... *H01J 37/32018* (2013.01); *H01J 37/3171* (2013.01); *H01J 27/26* (2013.01); *H01J 49/167* (2013.01); *H01J 37/32009* (2013.01)
USPC .... 250/423 R; 250/424; 250/426; 250/423 F; 250/492.21

(58) Field of Classification Search
CPC ................ H01L 21/265; H01L 21/2652; H01L 21/26586; H01L 21/3065; H01L 21/67069; H01L 21/67213; H01L 27/1214; H01L 29/78621; H01L 21/78624; H01J 27/18; H01J 27/143; H01J 27/146; H01J 37/006; H01J 37/08; H01J 37/32357; H01J 37/32376; H01J 37/32532; H01J 37/3266; H01J 37/32678; H01J 37/32825; H01J 37/32935; H01J 49/14; H01J 49/40; H01J 49/0468
USPC .............. 250/423 R, 423 F, 424, 426, 492.21
See application file for complete search history.

(56) References Cited

U.S. PATENT DOCUMENTS

| | | | | |
|---|---|---|---|---|
| 5,017,835 A | * | 5/1991 | Oechsner ................. | 315/111.81 |
| 5,075,594 A | * | 12/1991 | Schumacher et al. ... | 315/111.21 |
| 5,369,336 A | * | 11/1994 | Koinuma et al. ........ | 315/111.21 |
| 5,973,447 A | * | 10/1999 | Mahoney et al. .......... | 313/359.1 |
| 6,167,112 A | * | 12/2000 | Schneider ........................ | 378/43 |
| 6,320,388 B1 | * | 11/2001 | Sun et al. ...................... | 324/464 |
| 6,518,567 B1 | * | 2/2003 | Ganeev et al. ................ | 250/282 |
| 6,633,133 B1 | * | 10/2003 | Ishida ..................... | 315/111.81 |
| 6,700,329 B2 | * | 3/2004 | Giapis et al. ............. | 315/111.21 |
| 6,728,337 B2 | * | 4/2004 | McGeoch ...................... | 378/119 |
| 7,116,054 B2 | * | 10/2006 | Zhurin ..................... | 315/111.41 |
| 7,326,937 B2 | * | 2/2008 | Mehta et al. ............... | 250/423 R |
| 7,400,096 B1 | * | 7/2008 | Foster et al. .............. | 315/111.41 |
| 7,586,109 B2 | * | 9/2009 | Perel et al. ............... | 250/492.21 |
| 7,622,727 B2 | * | 11/2009 | Shirai et al. ............... | 250/504 R |
| 7,692,165 B2 | * | 4/2010 | Winkler .................... | 250/492.21 |
| 7,714,965 B2 | * | 5/2010 | Chien et al. .................... | 349/124 |
| 7,855,357 B2 | * | 12/2010 | Truche et al. ................. | 250/288 |
| RE43,078 E | * | 1/2012 | Cody et al. ................... | 250/288 |
| 8,207,496 B2 | * | 6/2012 | Makarov et al. .............. | 250/288 |
| 8,217,343 B2 | * | 7/2012 | Cooley et al. ................. | 250/288 |
| 2005/0279458 A1 | * | 12/2005 | Okumura et al. ........... | 156/345.47 |
| 2007/0063147 A1 | * | 3/2007 | Yamazaki et al. ........... | 250/424 |
| 2011/0109226 A1 | * | 5/2011 | Cooley et al. ............ | 315/111.21 |

(Continued)

*Primary Examiner* — David A Vanore
(74) *Attorney, Agent, or Firm* — Barry N. Young

(57) ABSTRACT

A high pressure microplasma source operating in a normal glow discharge regime is used to produce a cold bright focused beam of $Xe^+$ and/or $Xe_2^+$ ions having ion temperature of the order of 0.5-1 eV and a current density on the order of 0.1-1 $A/cm^2$ or higher for focused ion beam applications.

19 Claims, 3 Drawing Sheets

U.S. PATENT DOCUMENTS

| | | | |
|---|---|---|---|
| 2011/0175531 A1* | 7/2011 | Urdahl et al. | 315/111.21 |
| 2011/0180699 A1* | 7/2011 | Cooley et al. | 250/282 |
| 2011/0181169 A1* | 7/2011 | Eden et al. | 313/231.31 |
| 2011/0192968 A1* | 8/2011 | Makarov et al. | 250/282 |
| 2012/0063966 A1* | 3/2012 | Liao et al. | 422/186 |
| 2012/0192792 A1* | 8/2012 | Mahajani et al. | 118/723 R |
| 2012/0235056 A1* | 9/2012 | Makarov et al. | 250/423 R |

* cited by examiner

MICROPLASMA ION SOURCE FOR FOCUSED ION BEAM APPLICATIONS

BACKGROUND

This invention relates generally to focused ion beam (FIB) systems and methods, and more particularly to a low temperature microplasma bright ion source for FIB applications.

Focused ion beam processes are widely used in the semiconductor industry for applications such as integrated circuit (IC) circuit editing (CE)—for debugging and verification of the functionality of ICs. Circuit editing involves modification of individual IC circuits in order to correct design or manufacturing errors that cause IC malfunctions. Currently, FIB systems use a finely focused beam of gallium ions that can be operated in a range of beam currents from several pico-Amperes (pA) up to tens of nano-Amperes (nA). Gallium ion beam technology uses a liquid metal ion source (LMIS) that enables a $Ga^+$ ion beam to be focused down to a nanometer size at low beam currents (on the order of 1-10 pA), which is important and required for successful CE operations on ICs manufactured using current technologies.

Although current LMIS technology has the ability to focus a $Ga^+$ ion beam down to nanometer scale, the use of $Ga^+$ ions is becoming problematic for CE applications on more advanced ICs. This is happening for two main reasons. First, as IC technology is moving towards increasing complexity, the dimensions of all of the IC components scale down. This includes the vertical (depth) dimensions between metallization layers and the thicknesses of the layers themselves, including the "active silicon" layer. Currently 30 keV $Ga^+$ ions are used in FIB technology, a relatively high energy that is needed to focus the beam down to a nanometer sized spot. But at this energy, $Ga^+$ ions are implanted into a modern IC structure to a depth which is comparable to the thicknesses of the metal and active layers. This $Ga^+$ ion implantation and the accompanying atomic cascades that result from the implantation combine to create damaged layers in the IC structure that are comparable in their dimensions to the functional layers of the IC. This damage can compromise the ability of the IC to work properly after such a modification. Secondly, since Ga is a conductive metal, the implantation of $Ga^+$ ions can cause electrical short circuiting of the IC layers to each other or other malfunctioning of the IC.

To minimize such problems, it is desirable to limit the depth of penetration of the ions into the IC materials, which may be accomplished, for instance, by using heavier ions that have shallower penetration ranges into the IC materials. Additionally, it is desirable to use ions that, when embedded in the IC substrate material, do not form an electrically conductive layer. For example, non-conductive ions, as of inert gases, may be used in a FIB to avoid the electrical issues associated with $Ga^+$ ions since they do not form a conducting layer or conducting inclusions. Xenon (Xe) is an inert gas which has a mass (132 amu) that is about twice that of Ga (69 amu). Xenon produces $Xe^+$ and $Xe_2^+$ ions which can be obtained from a plasma. However, previous attempts to use a plasma source for forming a focused $Xe^+$ or $Xe_2^+$ ion beam have not been successful because of the inability to obtain an ion beam with a suitable current density that can be focused down to the required nanometer scale spot size. Conventional plasma sources have a plasma volume of the order of 1 $cm^3$ and an electrode area of about 1 $cm^2$. The reason for the inability to finely focus the ions from this conventional plasma source lies in the well-established physics of glow discharges, including evolutions of plasma discharge regimes with growing electric current and gas pressure. For a FIB application, an ion source should be "bright", i.e., have an ion current density of at least about 1 $A/cm^2$ or higher. Otherwise, either the FIB operation would proceed too slowly or the ion source size would have to be so large that fine focusing would not be possible. In a conventional plasma source having a discharge volume on the order of 1 $cm^3$ with electrode surface area of about 1 $cm^2$, this would require a current of approximately 1 A, which is very high and the plasma would become unstable and unusable. Furthermore, in order to focus the ions down to a nanometer size for CE operations, it is important that the mean ion energy (which is proportional to the ion temperature) not exceed a few eV. Otherwise, the ion energy spread would create chromatic aberrations that would excessively broaden the spot size of the focused beam and make it unusable for CE on newer ICs.

The two conditions, i.e., high current density (brightness) and low temperature (coldness) of the ions, have to be obtained simultaneously, which cannot be done in a conventional normal glow discharge plasma. With a normal glow discharge (NGD), the temperature of the gas including the ions can be quite low (approximately 300-1000 K) in the positive column. However, the electrons in the discharge have an effective temperature typically of about 1-3 eV (approximately 12,000-36,000 K). The ion temperature in the plasma cathode sheath from which ions would be extracted for the use in a FIB is typically of the order of 0.5-1 eV, whereas the electron temperature (defined in terms of the mean electron energy) in the cathode sheath can reach approximately 10 eV. This state with widely separated electron and gas/ion temperatures can be sustained by a relatively low rate of Joule heat release and a sufficient rate of the gas natural cooling. The current density J in normal glow discharges is proportional to the square of the gas pressure, p, and the ratio $J/p^2$ is on the order of 10 $\mu A/(cm^2 \times Torr^2)$ for Xe.

Therefore, in order to obtain a current density of about 1 $A/cm^2$, a normal glow discharge in Xe would have to operate at a high pressure of about 300 Torr or greater. However, in conventional macroscopic (i.e., geometric sizes approximately 1 cm) plasmas, normal glow discharges cannot be sustained at such high pressures and high current densities. Increasing gas pressure and current density eventually leads to the onset of abnormal glow discharge (AGD) which is characterized by elevated currents, but also a significant increase in the cathode voltage drop, resulting in a very high temperature of the ions in the cathode sheath, about 10 eV and higher at current densities of the order of 1 $A/cm^2$. Moreover, the AGD regime at high currents is susceptible to instabilities and, in particular, to constriction and arcing (glow-to-arc transition). The onset of constriction and arcing instabilities limits the current in glow discharges in inert gases typically to about $10^{-2}$ A. Accordingly, current densities in conventional plasmas are limited to about $10^{-2}$ $A/cm^2$ which are far lower than required.

It is desirable to provide bright low temperature plasma sources of non-conductive high mass ions, as for example inert ions of inert gases such as xenon, for FIB operations that avoid the foregoing and other problems of conventional plasma sources, and it is to these ends that the present invention is directed.

SUMMARY OF THE INVENTION

In one aspect, the invention recognized that the foregoing and other problems associated with conventional plasma sources in obtaining a suitable bright, low temperature source of positive ions with narrow energy spread for FIB operations can be avoided by using a high pressure normal glow discharge microplasma (microdischarge) to ionize a suitable working gas to produce the ions. Microplasma sources operating in the normal glow discharge regime at high (hundreds of Torr) pressure have not previously been used to produce ions. The microplasma source has a small plasma chamber with linear sizes on the order of 1 µm-1000 µm or so in all three dimensions and operates in the normal glow discharge regime at plasma pressures up to 1000 Torr or higher to produce a flux of ions with a low energy spread not exceeding approximately 2.4 eV, which is approximately full width at half maximum (FWHM) of a Boltzmann energy distribution function at an average energy 1 eV. In a normal glow discharge, current density is proportional to the square of the gas pressure. Thus, the current density in the plasma can be continuously adjusted from a low of the order of about $10^{-2}$ $A/cm^2$ to a high of the order of about 1 $A/cm^2$ or greater by controlling the gas pressure, so that a desired ion current can be extracted from a small pinhole opening in the cathode, the opening having size in the range of about 10 nm-2000 nm.

In another aspect, the invention affords a source of ions for FIB applications that comprises a microplasma source for producing cold bright flux of positive ions having an ion energy spread not exceeding approximately 2.4 eV, an electrostatic extraction appliance for extracting the ions from the microplasma source through a small pinhole opening in a cathode, the opening having a size in the range of about 10 nm-2000 nm. The extracted ions are accelerated and directed into a FIB column that may be equipped with a mass-filter for separation of desirable types of ions, such as $Xe^+$ or $Xe_2^+$ (or other suitable ions) and for focusing the ions to produce a focused ion beam having a nanometer or smaller-sized spot on the target object.

DESCRIPTION OF PREFERRED EMBODIMENTS

In order to obtain a cold (normal glow discharge ion temperature in the range of 0.5-1 eV), bright (current density in the range of 0.1-1 $A/cm^2$ or higher) flux of positive ions of a suitable gas, for example an inert noble gas, such as xenon, for use in focused ion beam (FIB) applications, the invention uses a high pressure normal glow discharge microplasma source, preferably having a parallel plate geometry. However, unlike macroscopic plasma sources having sizes of the order of 1 cm and which cannot sustain normal glow discharges at high pressures and high current densities, these microplasma sources with the chamber dimensions of about 1-1000 µm, can sustain normal glow discharge over a wide range of gas pressures and electrical currents, and at particular high gas pressures and currents in the desired ranges. Microplasma sources comprise devices having various different architectures, geometries, and electrode structures, many of which may be used to practice the invention.

Figure 1A:
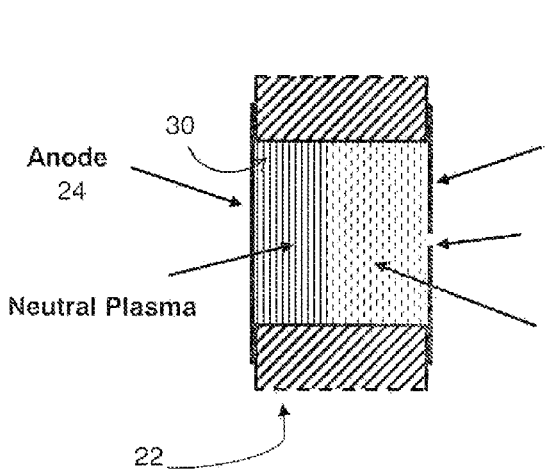
FIGS. 1A-1B are, respectively, a vertical cross sectional view and an end elevation view from an anode end of a microplasma source that may be used to practice the invention.
Figure 1B:
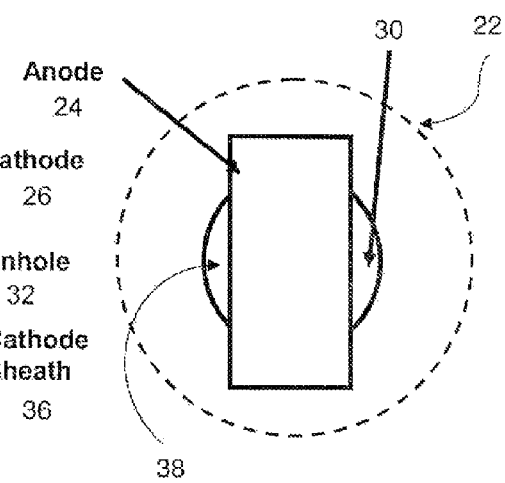
Figure 2:
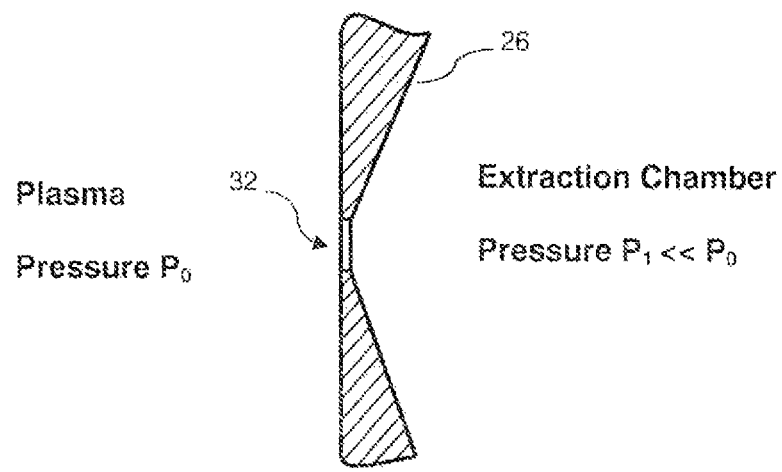
FIG. 2 is a diagrammatic cross sectional view of the profile of a preferred wide angle, tapered thin extraction pinhole in a cathode of the microplasma source of FIGS. 1A-B.
Figure 3:
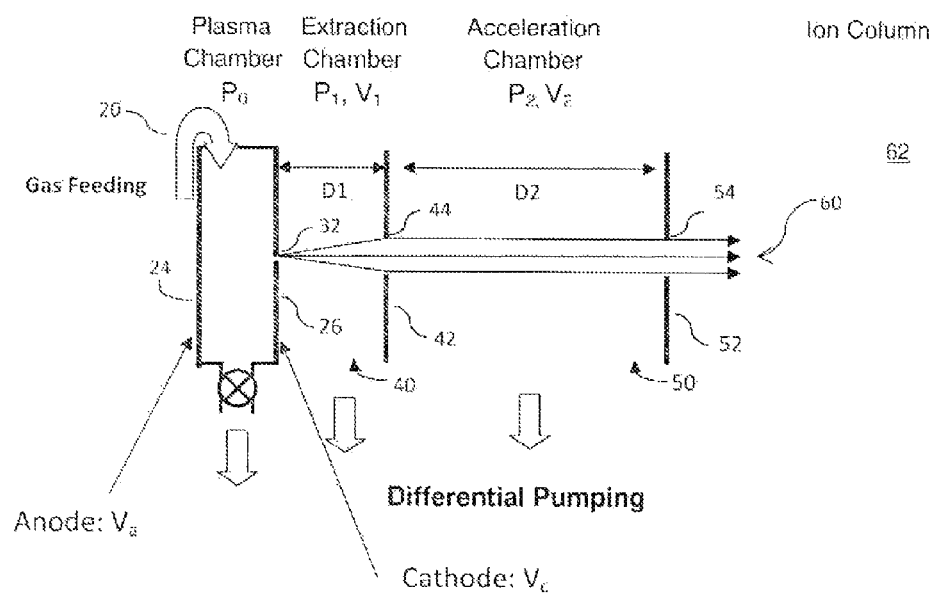
FIG. 3 is a diagrammatic view of a FIB system comprising the microplasma source of FIGS. 1A-B with ion extraction, acceleration and focusing mechanisms.

One embodiment of the invention uses a microplasma source 20 such as illustrated in FIGS. 1-3. As shown in FIGS. 1A-B, the microplasma source may have a parallel plate geometry comprising a dielectric cylindrical member 22 having a pair of electrodes comprising an anode 24 and a cathode 26 positioned at opposite ends of the cylindrical member to form a plasma chamber 30. The anode and cathode are respectively connected to positive and negative potentials, e.g., the positive and negative terminals of a voltage source (not shown); or the anode may be connected to the positive terminal of the voltage source, and the cathode may be electrically grounded; or the cathode may be connected to the negative terminal of the voltage source, and the anode electrically grounded, to establish an electric field within the chamber. The interior of the chamber may be filled with a high pressure working gas, preferably an inert gas such as xenon, to form a gas-filled microdischarge with the anode and cathode forming opposing parallel electrically conducting walls. The internal dimensions of the microcavity structure may be in the range of 1-1000 µm. A small pinhole 32 having a diameter of the order of about 10-2000 nm, and in one embodiment preferably about 50 nm, may be provided in the cathode for the extraction of positive ions. The inert gas may be supplied under high pressure to the interior of the chamber through gaps 38 (see FIG. 1B) between the anode 24 and the microplasma chamber 30.

The pinhole 32 in the cathode from which the ions are extracted is preferably at the narrowest thickness of a wide angle tapered cathode plate with thin edges, as illustrated in FIG. 2, to minimize collisions of ions with the walls of the opening that can cause ion recombination. Preferably, the diameter of the pinhole is of the order of 10-2000 nm, as stated, and the thickness of the cathode plate is preferably about one-fifth ($\frac{1}{5}^{th}$) or less than the diameter of the pinhole. This minimizes the interaction of ions passing through with the walls of the pinhole, and the tapered configuration allows the cathode to have sufficient structural integrity to accommodate the pressure differential ($P_0$-$P_1$) between the plasma chamber and the extraction chamber and the current density of the extracted ions. If the cathode plate is thin, ions passing through the pinhole will have little interaction with the walls of the opening, and the extracted ion energy distribution (EIED) will coincide substantially with the ion energy distribution in the plasma. Some ions when passing through the pinhole from the plasma may experience additional interactions with the pinhole walls and with neutral atoms that can lead to modification of the ions energy distribution. The tapered pinhole profile and thin-walled cathode minimize interactions between the ion beam and the pinhole so that the effect of the pinhole on the EIED can be neglected. Additionally, the type of material of the cathode and pinhole 32 and its substrate including whether it is electrically conducting, non-conducting (dielectric) or semiconducting materials, as well as an auxiliary electric potential applied to the pinhole, may be used to minimize undesirable interactions between the extracted ion beam and the pinhole, while facilitating the ion beam extraction from the microplasma chamber 30.

Within the microplasma chamber away from the cathode the plasma is quasi-neutral as it contains electrons and positively ionized atoms with almost equal densities. However, closer to the cathode the negative potential repels electrons and attracts positive ions creating a layer or sheath 36 where a large fraction of the entire potential difference and electric field variation between the anode and the cathode occurs. The electrons emitted from the cathode are energized and cause avalanche ionization, and the ions are accelerated towards the cathode.

A normal glow discharge can exist in a wide range of current densities between the dark Townsend discharge and the high-current abnormal glow discharge. The cathode sheath voltage fall, the ratio of the electric field to the gas number density (E/N) in the sheath, and the product (d×N) of the sheath thickness d and the gas number density N, are almost independent of gas density. The cathode sheath thickness in a normal glow discharge may be several dozen times greater than the ion mean free path, and therefore the ions in the sheath acquire a near-Boltzmann energy distribution function with a temperature determined by the acceleration of ions in the strong sheath electric field and the collision randomization of the velocity imparted by the field. Estimates show that the ion temperature in the sheath is approximately equal to two-thirds of the work done by the sheath electric field in a distance equal to the mean free path of the ions. For the typical parameters of a cathode sheath in glow discharges in noble gases, the ion temperature in the sheath is on the order of 1 eV or lower. In a microplasma discharge, normal glow can be extended up to current densities of about 1 A/cm$^2$ and higher while still having an ions energy spread as narrow as 2.4 eV which is roughly the full width half maximum (FWHM) of a Boltzmann distribution at an ion temperature of 1 eV.

In low-temperature non-equilibrium electric discharges in inert gases, such as Xe, the primary atomic ions, e.g. Xe$^+$, are efficiently converted during three-body collision processes, such as Xe$^+$+Xe+Xe→Xe$_2^+$+Xe into more stable molecular ions Xe$_2^+$. The rates of these three-body processes increase with the gas pressure, resulting in a dominance of molecular ions (Xe$_2^+$) in bulk weakly ionized plasmas at high pressures. In the invention, the flux of ions reaching the cathode, and thus the ion-extraction pinhole, comprise ions entering the sheath from the quasi-neutral plasma region and then traversing the sheath toward the cathode, as well as ions that are formed directly in the sheath and then move toward the cathode. At gas and plasma conditions of 100-1000 Torr and a current density on the order of 1 A/cm$^2$, the ions originating in the quasi-neutral plasma will be predominantly molecular. At preferred operating conditions the atomic ions that are formed in the sheath have a significant probability of being converted into molecular ions before they reach the cathode. Therefore, a significant percentage of the flux of ions reaching the ion-extraction pinhole will be molecular ions.

In accordance with the invention, by forming the ion beam with molecular ions instead of the single atomic ions, the parameters of the beam interaction with solid materials are significantly improved. Ion beam bombardment of a solid creates under the surface of the solid an "altered layer" (AL) that contains implanted ions, displaced domestic atoms, and other defects induced by ion-atomic collision cascades. Under continuous ion bombardment, as the solid material is removed by sputtering or chemically assisted etching, the AL moves deeper into the solid as the sputtering/etching proceeds. The thickness (depth) of the AL depends on the energy and mass of the ions as well as the solid material and its density. The thickness of the AL, which can be also referred to as a "FIB depth resolution", is one of the main parameters that define the applicability of the FIB process to circuit editing of a given IC. Modern ICs have a very complex multi-layered structure of interconnects normally arranged as a stack of alternating metal layers isolated from each other with conventional (SiO$_2$) and/or low-k dielectrics, and containing etch-stop barrier and other technological layers. As the ICs become more and more complex, the vertical distances between the layers tend to shrink. Moreover, to reduce parasitic capacity of the circuitry, in the current technology new types of dielectrics with reduced dielectric constant, k, are increasingly being used. These materials normally have a much weaker structure than SiO$_2$ as they contain carbon, and they can be destroyed by the ion beam much easier. It is important for the success of the CE operation that when a FIB operation is performed on a metal layer, the ion beam does not penetrate all the way through the dielectric that isolates one metal layer from the next one. Consequently, the AL thickness should not exceed the vertical gap between these layers, and the FIB operating conditions must be adjusted so that the AL thickness does not exceed the layer separation for a given stack of materials.

Ways of reducing altered layer (AL) thickness include increasing the mass of the ions, decreasing of the ion energy, or both, as each of these would reduce ion penetration and AL thickness layer for any solid under ion bombardment.

Using molecular ions, such as Xe$_2^+$, has the advantage of reducing by a factor of two the effective energy of the beam interaction with a solid. Indeed, a Xe$_2^+$ ion beam can be accelerated as in conventional FIB applications to an energy of approximately 30 keV, and, therefore, can be focused down to the nanometer spot sizes required in modern FIB applications. However, upon impacting a solid surface, Xe$_2^+$ almost instantly dissociates into two atoms of xenon (one of which may be ionized) each with one-half of the energy, or 15 keV. Therefore, the ion interaction with the solid will be same as an ion beam energy of 15 keV, without compromising ion beam spot quality. As the atomic mass of a xenon atom is almost twice that of Gallium (132 a.u. vs. 69 a.u. for main isotopes) and the energy per xenon atom in a cluster ion is half that of a gallium atom, a significant improvement in the depth resolution is obtained for FIB operations when Xe$_2^+$ ions are used instead of Ga$^+$ ions. Additionally, this enables improvement in ion beam spot size. Even if the beam is accelerated up to 40 keV instead of 30 keV, the energy per atomic particle of xenon would still be only 20 keV, which is significantly lower than 30 keV and means better depth resolution. Furthermore, the spot size (lateral resolution) obtainable at an ion energy of 40 keV is better than at 30 keV. Therefore, cluster ions can significantly improve both lateral and depth resolution for FIB operations.

FIG. 3 illustrates diagrammatically a system for producing a focused ion beam that uses the ion source 20 in combination with extraction and acceleration chambers to produce a focused ion beam. As shown, an inert gas such as xenon is supplied to the chamber 30 of the microplasma source 20 at a relatively high pressure, P$_0$, which may be in the range of about 10-1000 Torr. Appropriate voltages, V$_a$ and V$_c$, are applied to the anode 24 and cathode 26, respectively, to establish a normal glow discharge plasma within the chamber. Anode voltage V$_a$ may be in the range of about 100-300 Volts, and cathode voltage V$_c$ is preferably at about 0 Volts. Ions are extracted from the microplasma chamber through pinhole 32 into an extraction chamber 40 having an extraction electrode 42 with a central opening 44. The extraction electrode is spaced a distance D1 from the cathode. A relatively low voltage, V$_1$, of about −1 Volt, may be applied to the extraction electrode 42. Ions extracted from the microplasma chamber 30 into the extraction chamber 40 are further extracted from the extraction chamber via opening 44 in the extraction electrode 42 and enter an acceleration chamber 50 where the ions are accelerated, extracted at 60, and directed to an ion column 62 to be focused and to form a focused ion beam. The acceleration chamber has an acceleration electrode 52 that may be spaced a distance D2 from the extraction electrode, and have a high acceleration voltage V$_2$ of the order of about −30 kVolts applied to it. The acceleration electrode may have a central opening 54 for the extracted ions 60. The extraction and acceleration chambers 40, 50, respectively, may be differentially pumped to low pressures $P_1$ and $P_2$, respectively, which each may be of the order of about $10^{-7}$ Torr, and the distances D1 and D2 may be selected to optimize the focused ion beam quality.

In order to form a focused ion beam, acceleration of ions up to the energies of the order of several tens of keV (typically 20-30 keV) is necessary. Generally, the higher the acceleration voltage, the smaller the spot size to which the beam can be focused. A key factor affecting beam focusing quality is uniformity of the beam in terms of both kinetic energy of the ions and their motion directionality. The extraction of ions from the microplasma chamber can cause broadening of the energy distribution of the extracted ions, which is why a relatively small extraction voltage is used on the extraction electrode 42. Indeed, the electric field in the differentially pumped extraction chamber 40 can be comparable with or even higher than the electric field in the cathode sheath. The ion mean free path can be longer than that in the sheath due the decreasing gas pressure, but still short enough to allow a few collisions during ion residence in the chamber. Additional collisions of ions with the walls of the extraction pinhole 32 are also possible, and these can cause aberrations and energy spread. Thus, the ion temperature in the differentially pumped extraction chamber is typically higher than that in the discharge sheath, which can affect the ability to focus the ion beam down to nanometer scale spot. If a significant number of ions in the beam have energies that are noticeably different from the mean value, the focusing size will be broadened. An extracted ions energy distribution temperature of about 10 eV could significantly broaden the directionality of the ion beam even after acceleration to 30 keV. In fact, a 10 eV contamination in a 30 keV beam could potentially create a deviation from the main beam direction of about $\mathrm{atan}(10/30000)^{1/2}$ which is about 1 degree, a very large value. This illustrates the need for minimizing energy spread and the desire for monokinetic energy ions in the extracted ion beam.

In order to minimize the energy spread of extracted ions, the electric field in the extraction chamber should be as low as possible and still be practical, the gas pressure should be reduced as quickly as possible, and collisions with the walls of a extraction pinhole should be minimized. Thus, the extraction voltage is preferably selected to be about −1 V, and the pinhole is wide-angled, tapered, and thin-walled, as previously described. This pinhole profile helps in rapidly reducing the gas pressure and in reducing the number of ion collisions with pinhole walls.

The gas temperature on the discharge side of the pinhole may not be much above the room temperature of 300 K. At a pressure of approximately 300 Torr, the mean free path of atoms (with respect to collision with other atoms) in the pinhole is on the order or 300 nm, larger than the preferred pinhole diameter of 10-100 nm. The ion mean free path depends on the ion temperature. Calculations show that with both ions and atoms at room temperature, the polarization-dominated cross-section is about $2 \times 10^{-14}$ cm$^{-2}$, and the mean free path for ions with respect to collisions with atoms at 300 Torr is about 50 nm. If the mean kinetic energy of the relative ion-atom motion is 0.5 eV or higher, the cross-section would be about $3 \times 10^{-15}$ cm$^{-2}$, and the mean free path for ions with respect to collisions with atoms at 300 Torr would be about 300 nm.

Calculations of the essentially free-molecular expansion of the gas from the pinhole into the vacuum chamber show that at a distance from the pinhole equal to twice the pinhole diameter the gas density drops by an order of magnitude, and at a distance equal to six times the pinhole diameter it drops by two orders of magnitude compared with the density at the pinhole. Therefore, for a pinhole diameter of the order of 10 or 50 nm, the ion motion at a distance of several tens of nanometers or a few hundred nanometers, e.g., 60-300 nm, respectively, becomes essentially collision-less, enabling efficient ion acceleration without scattering.

While the foregoing has been with reference to particular embodiments of the invention, it will be appreciated that changes in these embodiments may be made and that the invention is defined by the appended claims.

The invention claimed is:

1. A method of forming a small and bright source of positive ions having narrow energy spread, comprising introducing a working gas into a microplasma chamber; producing a plasma operating in a normal glow discharge regime to ionize the working gas to generate positive ions; extracting the positive ions from a pinhole of the microplasma chamber and adjusting the gas pressure in the microplasma chamber to obtain a predetermined current of the extracted ions.

2. The method of claim 1, wherein said working gas comprises xenon, and said extracting comprises extracting $Xe^+$ and $Xe_2^+$ ions from said microplasma chamber to have an ion temperature in the range of about 0.5-1 eV.

3. The method of claim 1, wherein said adjusting comprises adjusting the ion current for a current density in the range of about 0.1-1 A/cm$^2$ or higher.

4. The method of claim 1, wherein said microplasma chamber has dimensions in the range of about 1-1000 μm, and said method comprises introducing xenon gas as a working gas into said chamber at a pressure in the range of about 100-1000 Torr, and applying a potential difference of the order of about 100-1000 volts within said chamber to ionize the gas.

5. The method of claim 4, wherein said pinhole is in a cathode wall of the microplasma chamber, the cathode wall having a tapered thickness narrowing at said pinhole, and the pinhole having an opening size in the range of about 10-2000 nm.

6. The method of claim 4, wherein said extracting the ions from the microplasma chamber comprises using an extraction voltage of about −1 Volt, and the method further comprises accelerating said ions using an accelerating voltage in the range of about 20-30 kV, said extracting and said accelerating being at a pressure of about $10^{-7}$ Torr or less, and directing said ions to an ion column to form a focused ion beam.

7. A cold bright source of positive ions, comprising:
a microplasma chamber containing a working gas; a plasma in the chamber operating in a normal glow discharge regime for ionizing the working gas to produce positive ions; and an extraction mechanism for extracting positive ions through a pinhole in said microplasma chamber, the gas pressure in the microplasma chamber being adjusted for an extracted ion current density in the range of about 0.1-1 A/cm$^2$ or higher.

8. The positive ion source of claim 7, wherein said working gas comprises xenon and said extracted ions comprise $Xe^+$ and $Xe_2^+$ ions having an ion temperature in the range of about 0.5-1 eV.

9. The positive ion source of claim 8, wherein the microplasma chamber has dimensions in the range of about 1-1000 μm, and said xenon gas in said microplasma chamber has a pressure adjusted to be in the range of the order of about 100-1000 Torr, said gas pressure being adjusted to provide a predetermined ion current density.

10. The positive ion source of claim 7, wherein said microplasma chamber comprises a dielectric member having a chamber therein with an anode and a cathode as respective electrically conductive end walls of said chamber, the cathode having said pinhole through which Xe+ and/or $Xe_2^+$ ions are extracted, and said pinhole has an opening size in the range of about 10-2000 nm.

11. The positive ion source of claim 10, wherein said pinhole has an opening size of the order of 50 nm.

12. The positive ion source of claim 10, wherein said cathode has a tapered wall thickness that is thin at said pinhole to minimize interaction between the extracted $Xe^+$ and/or $Xe_2^+$ ions and the cathode wall, said thin wall thickness at said pinhole being about one-fifth of said opening size.

13. The positive ion source of claim 10, wherein said extraction mechanism comprises a chamber having a pressure of the order of $10^{-7}$ Torr and an electrode to which an extraction voltage of the order of −1 volt is applied to extract said positive ions from said microplasma chamber through said pinhole.

14. The positive ion source of claim 7, further comprising an acceleration chamber for accelerating ions extracted from said microplasma chamber, said acceleration chamber having a pressure of the order of $10^{-7}$ Torr and comprising an acceleration electrode to which an acceleration voltage of the order of about −30 kVolts is applied to accelerate said ions.

15. The positive ion source of claim 14, further comprising an ion column for focusing said accelerated ions to form a focused ion beam.

16. A focused ion beam system, comprising:
a microplasma source operating in a normal glow discharge regime for producing positive ions from a working gas the positive ions having a narrow energy spread of the order of 2.4 eV or less;
an extraction chamber for extracting the ions from the microplasma source at a voltage of the order of −1 V;
an acceleration chamber for accelerating the extracted ions; and
an ion column for focusing said accelerated ions to form a focused ion beam.

17. The focused ion beam system of claim 16, wherein said working gas comprises xenon and said extracted ions comprise $Xe^+$ and $Xe_2^+$ ions having an ion temperature in the range of about 0.5-1 eV.

18. The focused ion beam system of claim 16, wherein said focused ion beam has an ion current density in the range of the order of about 0.1-1 A/cm² or higher.

19. The focused ion beam system of claim 16, wherein said microplasma source comprises a microplasma chamber containing xenon gas as said working gas, the microplasma chamber having dimensions in the range of about 1-1000 μm, and said xenon gas in said microplasma chamber having a pressure in the range of the order of about 100-1000 Torr.

* * * * *